(12) United States Patent
Corral

(10) Patent No.: US 6,489,586 B1
(45) Date of Patent: Dec. 3, 2002

(54) METHOD AND APPARATUS FOR VERIFICATION OF ASSEMBLED PRINTED CIRCUIT BOARDS

(75) Inventor: Abimael Corral, Austin, TX (US)

(73) Assignee: Cad-Tech, Inc., Austin, TX (US)

( * ) Notice: Subject to any disclaimer, the term of this patent is extended or adjusted under 35 U.S.C. 154(b) by 0 days.

(21) Appl. No.: 09/302,912

(22) Filed: Apr. 29, 1999

(51) Int. Cl.⁷ ............................................. B23K 26/00
(52) U.S. Cl. .......................... 219/121.6; 219/121.68; 219/121.67
(58) Field of Search ..................... 219/121.6, 121.67, 219/121.68, 121.69, 121.7, 121.71

(56) References Cited

U.S. PATENT DOCUMENTS

| | | | |
|---|---|---|---|
| 4,760,265 A | * 7/1988 | Yoshida et al. | 250/492.2 |
| 5,168,454 A | * 12/1992 | LaPlante et al. | 364/474.08 |
| 5,408,189 A | 4/1995 | Swart et al. | |
| 5,457,880 A | 10/1995 | McKinley et al. | |
| 5,611,691 A | 3/1997 | Poulain | |
| 5,617,990 A | * 4/1997 | Thompson, Sr. | 228/180.1 |
| 5,958,628 A | * 9/1999 | Balz et al. | 430/5 |

* cited by examiner

*Primary Examiner*—M. Alexandra Elve
(74) *Attorney, Agent, or Firm*—Thompson & Knight, LLP; H. Lisa Calico

(57) ABSTRACT

An overlay device and a method for making an overlay device for verifying the correct placement of assembled components on a printed circuit board. The overlay device has laser-cut cutouts to assist users to more precisely verify the correct assembly of components.

13 Claims, 2 Drawing Sheets

METHOD AND APPARATUS FOR VERIFICATION OF ASSEMBLED PRINTED CIRCUIT BOARDS

BACKGROUND OF THE INVENTION

1. Field of the Invention

The present invention relates generally to the field of electronics assembly, and more particularly, to the assembly of components onto printed circuit boards ("PCB's"). Specifically, this invention relates to a method and apparatus for verifying the correct placement of components on PCB's.

2. Description of Related Art

In applications in which components are assembled onto PCB's, it is often necessary to monitor the boards at a particular stage or stages, in order to determine whether the assembly process is performing properly. Specifically, it is desirable to verify the correct placement of the various components attached to a PCB in order to guard against common manufacturing problems before the entire manufacturing process is complete. PCB's that are found to be defective must either be repaired or discarded. The further along in the manufacturing process that a defect is caught, the more costly it is to repair, and the more time and money is wasted if the board must be discarded. Catching defects earlier in the manufacturing process cuts down on the time and money that is wasted in finishing a defective board that must either be repaired or discarded.

PCB's are often produced in lots. Boards within a given lot may tend to have problems resulting from tolerance error in the placement of components on the boards. Common manufacturing problems include missing and misplaced components. Components may be missing for a variety of reasons including incorrect programming, empty component trays or reels, misplaced trays or reels, or pick and place machine malfunction. "Misplaced components" include a number of different related problems. For example, a component's orientation could be incorrect or reversed. This is particularly problematic for components that are sensitive to polarity, such as diodes and capacitors. In addition, a component could be mounted askew on the mounting pad, causing it to perform unreliably or not at all. Another problem is known as "tombstoning", in which one side of a component pulls free from its mounting, resulting in an open circuit.

One way of verifying the correct assembly of components is through the use of a "functional test." Here, a PCB is completely assembled and then hooked to testing equipment to check whether it performs as expected. Because a board must be completely assembled before it is checked, the use of this test can be wasteful if the board fails because of a defect occurring early in the assembly process. Further, programming the testing equipment is often time and labor intensive, making it difficult to reconfigure to test different PCB's. In addition, the initial expense of the testing equipment is typically quite high.

Two other common verification methods are known as "in-circuit" testing and "automatic optical inspection". With in-circuit testing, a probe is used to test specific circuits to ensure that the circuit returns appropriate values to the a test stimuli. This test does not check the functionality of the board. Like the functional test, in-circuit testing usually occurs towards the end of the manufacturing process when many of the circuits are complete. Thus, the test is wasteful if the board does not pass due to a defect that occurs early in the manufacturing process. As its name suggests, automatic optical inspection utilizes equipment that automatically checks for the correct placement of components using optical recognition. The equipment required for both in-circuit testing and automatic optical inspection is usually quite costly. Further, reprogramming the equipment for use with different products and/or manufacturing lines is time consuming and fairly expensive.

Overlays may be used to quickly verify the location, placement and proper orientation of surface mount components on PCB's. Outlines of the individual components to be verified may be cut out of the overlay. Thus, an overlay may be configured to fit over an assembled PCB's such that the individual components project into the corresponding holes. An operator may quickly scan the overlay to verify the correct placement of components on the PCB.

Prior overlay devices are often significantly less expensive any of the three verification methods mentioned above. Overlay devices are an attractive option for contract circuit board manufacturers because they change their products and consequently their assembly lines quite often. It is often more practical to use an overlay designed for each assembly line rather than reprogramming the equipment in any of the three verification methods mentioned above.

However, drawbacks with prior art overlay devices have limited their usefulness. For example, many prior art, overlays are not very precise because the cutouts are made using unwieldy cutting devices such as mechanical routers. This problem is of particular consequence because the size of components is shrinking rapidly while their density on circuit boards is increasing at the same rate. In addition, verification using overlay devices requires the user to physically handle the circuit boards to be tested, exposing the boards to the risk of damage from static discharge if the overlays are made of static harboring materials such as phenolic or fiberglass. Similarly, there is a risk of electrical discharge with overlays made of conductive materials such as stainless steel. Stainless steel overlays are also fairly heavy and may have sharp edges that could cut the operator.

SUMMARY OF THE INVENTION

Disclosed is an overlay device and method of making an overlay for verifying the placement of components on PCB's. The disclosed overlay may be used to provide users a relatively simple, accurate, and inexpensive way of verifying the correct assembly of components on a PCB.

Advantageously, the disclosed overlay has static dissipative properties. Using the disclosed overlay, a user may be far less likely to damage components due to static and/or electric discharge. In one embodiment, the overlay may be made from a static dissipative material. In an alternative embodiment, the outer surface of the overlay may be coated with a static dissipative material.

As a further advantage, the cutouts of the disclosed overlay may be made by a high precision cutting device. Thereby, cutouts may more precisely correspond to the desired shapes of the components to be verified. In one embodiment, the high precision cutting device may be a laser. An advantage of using a non-mechanical cutting device such as a laser is that cutouts may be located closer to one another. The vibrations caused by mechanical cutting devices such as routers may have the tendency to tear through thin portions of overlay between cutouts that are located in close proximity to one another.

In various embodiments, the cutouts may be in the shape of polygons. In one embodiment, the shape of each polygon may correspond substantially to the shape of the respective target component, In another embodiment, the shape of each polygon may correspond to the shape of the leads of each respective target component. In an additional embodiment, the shapes of the polygons may correspond to the shape of the respective target component, the shape of the leads of each respective target component, or both the shape of the leads and the target component. Though polygon-shaped cutouts have been disclosed, it is to be understood by those of skill in the art that the cutouts may be cut into any desired shape that fits within the overlay.

In various embodiments, the disclosed overlay may be made from a light-weight and/or flexible material. Advantageously, such overlay devices may be easier to use than prior art overlay devices, particularly given the repetitive manner in which they may be used. Flexible overlays may be more resilient and less prone to cut operators than overlays made from rigid material such as stainless steel. As an additional advantage, the disclosed overlay may often be made much less expensively than other prior art verification technology.

In one respect, the present invention may comprise a method of manufacturing an overlay for verification of the correct assembly of a circuit board comprising the steps of obtaining a sheet of material, wherein at least the outer surface of the sheet has static dissipative properties, and cutting the sheet of material to create at least one cutout corresponding to a location on the circuit board of a respective targeted component to be verified. Further, the step of cutting the sheet of material may comprise using a high precision cutting device such as a laser. Also, each of the cutouts may be defined by substantially the shape of the respective targeted component, the respective targeted components' leads, or both. The sheet of material may be substantially opaque. The sheet of material may comprise static dissipative material.

In another respect, the present invention may comprise a method of manufacturing an overlay for verifying correct placement of components on a circuit board, comprising the steps of obtaining a static dissipative sheet; obtaining information from a design layout of the circuit board regarding at least one target component on the circuit board to be verified; determining size, shape and location specifications of at least one cutout corresponding to the at least one target component on the circuit board by using information obtained from the design sheet about the at least one target component; and precisely cutting the at least one cutout in the static dissipative sheet corresponding to the size, shape and location specifications of the respective at least one cutout. The design layout may be a "PCB" design layout. The present invention may further comprise the steps of storing the size and shape specifications of the at least one target component, and using the stored size and shape information to determine a size and shape of additional target components that are substantially similar to said at least one target component. The step of cutting the static dissipative sheet may further comprise using a high precision cutting device such as a laser. The present invention may also comprise the step of decreasing the thickness of the sheet of static dissipative material at predetermined locations. Further, the present invention may comprise the step of marking the sheet with alignment information. Also, the present invention may comprise the step of painting at least portions of the sheet with static dissipative paint.

In another respect, the present invention may comprise an overlay for verifying correct placement and alignment of at least one targeted component on a circuit board comprising a sheet of static dissipative material, defined by at least one laser-cut cutout at a predetermined location corresponding to a shape and location of the at least one targeted component to be verified. The overlay may further comprise alignment marks corresponding to the correct; alignment of the at least one targeted component. In addition, the sheet of static dissipative material may be flexible.

BRIEF DESCRIPTION OF THE DRAWINGS

FIG. 3($b$) is a cross-sectional view of an overlay used to verify the correct placement of a surface mounted component and its leads according to the embodiment shown in FIG. 3($a$).

DESCRIPTION OF ILLUSTRATIVE EMBODIMENTS

The following examples are included to demonstrate embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention.

Figure 1:
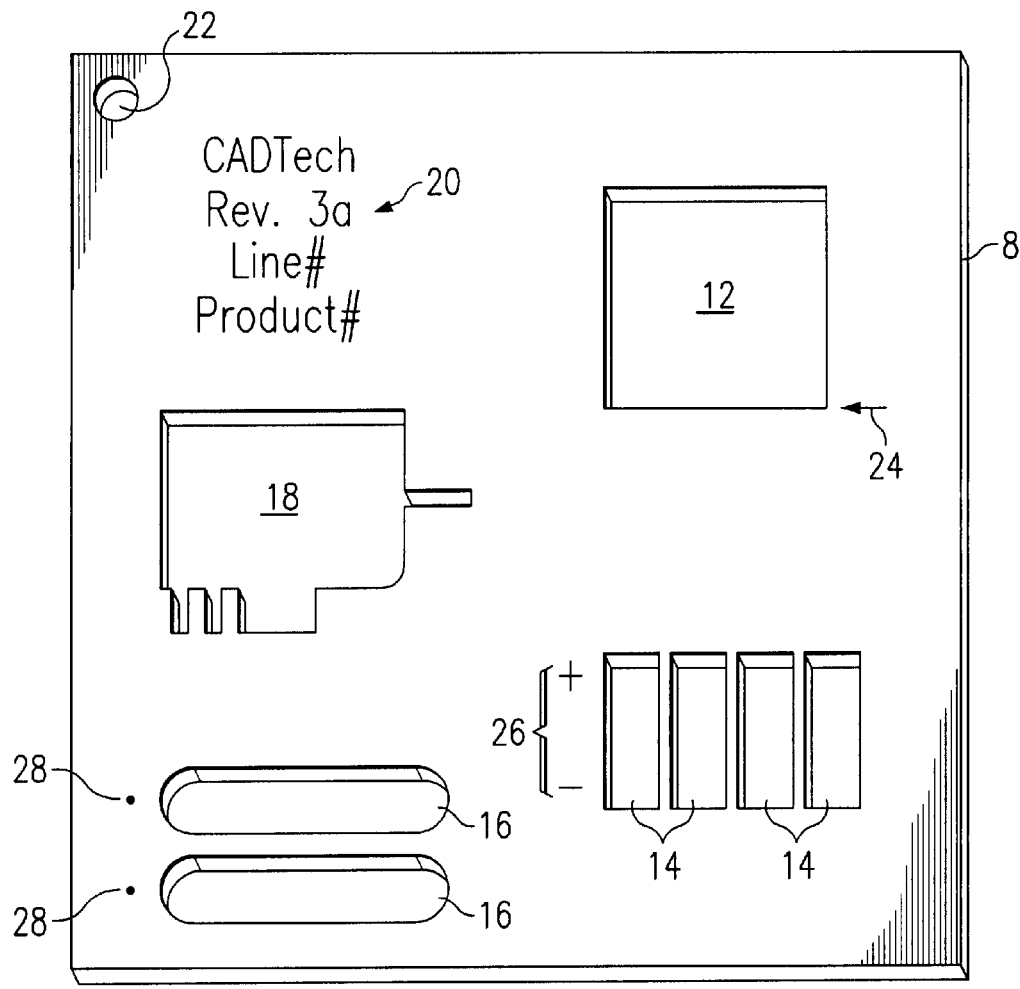
FIG. 1 is a simplified overhead view of an overlay according to one embodiment of the disclosed method and apparatus.

FIG. 1 illustrates an exemplary embodiment of the disclosed verification device which may be used to verify the correct assembly of components onto a printed circuit board at any time during the manufacturing process. As shown, the device may comprise sheet 10 of static dissipative material in which cutouts 12, 14, 16, 18, and 22 may be cut.

Sheet 10 may be any material that has static dissipative properties on its outer surface—such that any static electricity may be slowly dissipated to avoid damaging components. The surface resistivity of the material should be greater than about $10^6 \Omega$ to avoid damaging the components, for instance, by creating a short circuit. The surface resistivity of the material should be less than about $10^{12}\Omega$. Materials with a surface resistivity of greater than about $10^{12}\Omega$ may act as an insulator, i.e., building a static charge and also leaving harmful static electricity on the circuit board.

In an alternative embodiment, sheet 10 may be made from any material so long as its outer surface is coated with a static dissipative material. One such material is static dissipative paint. Any other static dissipative material may be used to coat the outer surface so long as it will adhere to the sheet. When sheet 10 is made from a non-static dissipative material with a static dissipative outer surface, care must be taken to ensure that the static dissipative surface is not worn away exposing the conducting (or insulating) material underneath.

In an exemplary embodiment, sheet 10 may be made from a solid sheet of static dissipative material. A benefit to this embodiment is that there is no outer surface that can be worn away. Further, many static dissipative materials are light and flexible, allowing for easy handling and use, reducing the risk of users cutting themselves on the overlay, increasing the overlays' durability, and decreasing the likelihood of damaging the assembled circuit boards, that are tested. It will be understood with benefit of this disclosure by those of skill in the art that the particular material that may be used for sheet 10 may be varied to suit different design constraints including but not limited to cost, color, and flexibility. For example, it is often desirable for the top surface of sheet 10 to be of such a color as to contrast with the color of the components allowing for easier visual inspection. One such material is a polycarbonate material named ZELUX. However, it is to be understood that sheet 10 may be made from a solid sheet of any static dissipative material, including but not limited to polycarbonates.

Cutouts 12, 14, 16, 18, and 22 may be formed by a high-precision cutting device. An example of a high-precision cutting device is as a laser. Ideally, the cutouts would be slightly larger than the respective components on the PCB for which the overlay 8 is designed such that the components would fit snugly in their cutouts. An operator could verify correct assembly by visually inspecting each cutout to ensure that it was filled with a component. Likewise, if overlay 8 did not completely fit over the PCB, a misplaced component would usually be the cause. Practically, however, the precision of an overlay is limited by the precision of the cutting device. With traditional means of cutting such as with a router, the cutouts were often significantly larger than the component making it much more difficult to check for misplaced components.

By using a high-precision cutting device, overlay 8 may be designed such that the cutouts correspond more precisely to their respective components, allowing the user to reliably check for misplaced and missing components. The type of cutting device that may be used is a function of the material that sheet 10 is made of. In one embodiment, a $CO_2$ laser may be used to cut, the cutouts in the ZELUX polycarbonate material. Other types of lasers or precision cutting devices may be used that one of skill in the art would recognize as capable of cutting sheet 10.

A cutting device that has a cutting diameter of 0.005 inches or less may produce cutouts that are sufficiently precise for most applications. Care must be taken when using mechanical cutting devices, because the vibrations caused the device may have a substantive negative impact on precision. For example, the narrow walls between rectangular cutouts 14 and rounded cutouts 16 would be impossible to preserve using a mechanical router—the vibrations would likely cause the thin walls to tear. In an exemplary embodiment, cutouts may be as close as 0.010 inches together by using a laser. As components become smaller and PCBs become more densely populated, the capability to have cutouts close to one another is a feature that is essential.

Further, as shown in FIG. 1, in an exemplary embodiment using a laser, the cutouts may easily take on a variety of shapes, including but not limited to polygons. For example, corners may be rounded as in cutouts 16 and 18, and alignment cutout 22. They may also be rectangular as in cutouts 12 and 14 to correspond to traditional component shapes. As depicted by cutout 18, a cutout may also be a custom shape to correspond to any irregular variations in a component's shape. The shapes, number, and position of the cutouts is a design decision based among other factors known in the art, and on the layout of the PCB.

Other information may be included on sheet 10 to assist the user in verifying the correct assembly of the PCB. There are a variety of ways that such information can physically be placed on sheet 10. Many methods are known in the art and include laser-etching, printing, engraving, or simply writing on overlay 10. For example, in one embodiment, overlay 8 includes overlay identification information 20, which allows a user to easily identify which product or point in the assembly process that the overlay is to be used with. Polarity marks 26 are useful to ensure that polarity sensitive devices including, but not limited to, diodes and capacitors are installed correctly. Similarly, alignment arrow 24 and alignment dots 28 may be included to assist users to quickly verify the correct orientation of components. It is understood that these are examples only, and that any other information that could assist a user can be placed on overlay 8.

In one embodiment, the location, size, and shape of the cutouts may be determined from a design layout of the PCB. Particularly, the location, size, and shape of the cutouts may be determined from information about the cutouts corresponding components contained in the PCB design layout. In another embodiment, the shape and size information for each type of component may be stored and recalled whenever a substantially similar component is used. In another embodiment, the determinations may be made using a computer.

In an alternative embodiment, portions of the overlay may decreased in thickness by not cutting completely through the overlay. This may allow the overlay to fit over the PCB and any projections (such as components that are not to be verified with a cutout) more snugly.

Figure 2:
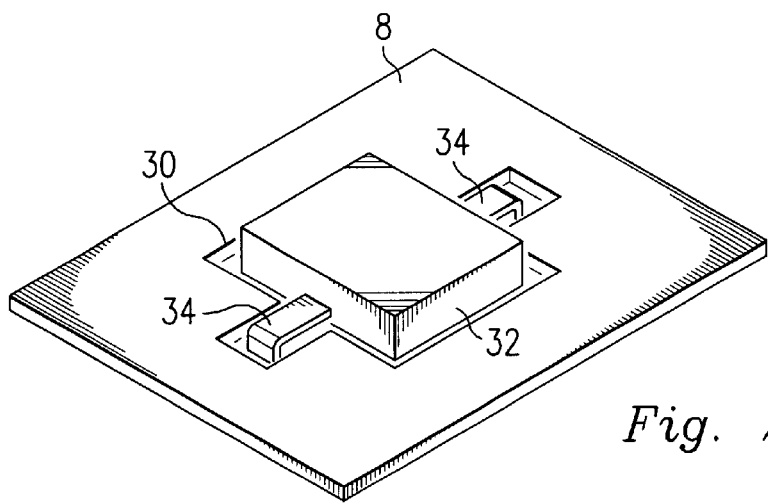
FIG. 2 is a simplified perspective view of an overlay used to verify the correct placement of a component with leads according to one embodiment of the disclosed method and apparatus.
Figure 3A:
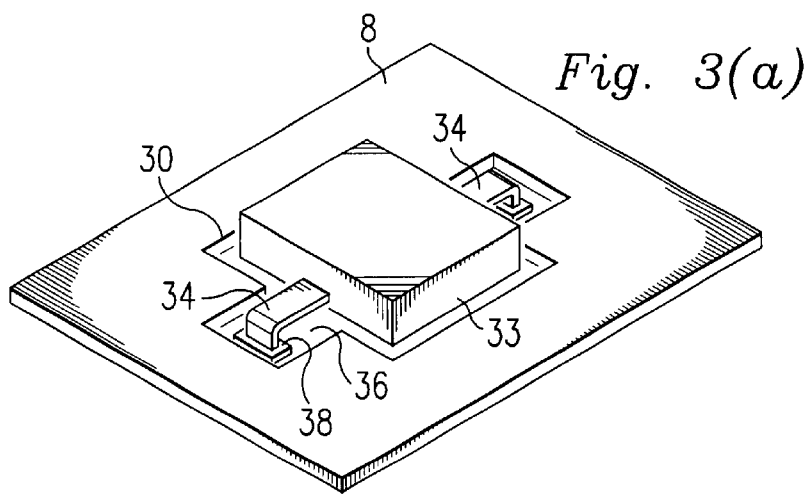
FIG. 3($a$) is a simplified perspective view of an overlay used to verify the correct placement of a surface mounted component and its leads according to one embodiment of the disclosed method and apparatus.
Figure 3B:
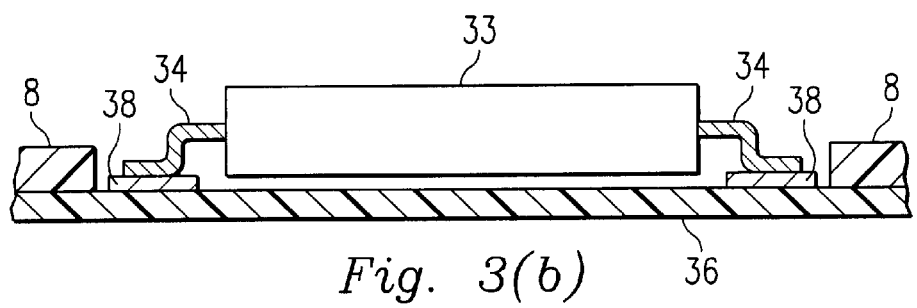
Figure 4:
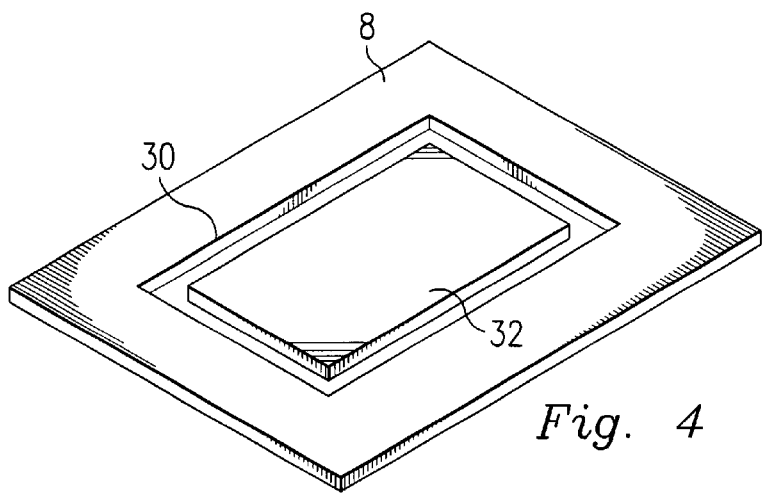
FIG. 4 is a simplified perspective view of an overlay used to verify the correct placement of a component according to one embodiment of the disclosed method and apparatus.

FIGS. 2 and 4 are perspective views of an example of overlay 8 used to verify the correct placement of component 32. Particularly, in FIG. 2, cutout 30 is shaped to allow a user to verify the placement of component 32 in addition to its leads 34. In one embodiment, cutout 30 may be shaped to allow users of the disclosed overlay to inspect the components' solder joints (the point on the PCB that the leads connect to PCB). By way of contrast, in FIG. 3, cutout 30 is shaped to allow a user to verify the placement of component 32 without regard to any leads or connections component 32 may have. The decision to include a component's leads in the shape of cutout 30 is left to the discretion of the designer.

The clearance required around a component is a function of many factors known in the art, including whether leads are to be accounted for in the shape of the cutout, the design tolerances of the circuit board, and density of components to be verified. As PCB's become more densely populated, it may be desirable for the clearance to be minimized. To maintain the structural integrity of the overlay, a minimum amount of overlay material must exist between cutouts, wherein the minimum amount is a function of the material that the overlay is made from. Since smaller clearances result in smaller cutouts, more cutouts per overlay may be used while maintaining the structural integrity. In addition, with less clearance, a user may more precisely measure whether a component is properly placed, of particular importance with components having a low placement tolerance.

FIGS. 3(a) and 3(b) depict views of an example of an overlay 8 that may be used to verify the correct assembly of surface mount component 33 and its leads 34. Surface mount component 33 may be affixed to PCB 36 by attaching its leads 34 to surface mount technology ("SMT") pads 38, which are part of PCB 36. As shown, overlay 8 may comprise a cutout 30 that is shaped to allow a user to verify that surface mount component 33 is correctly placed with regard to PCB 36, and more specifically, in relation to SMT pads 38. It is to be understood that though cutout 30 is shaped to show leads 34, the invention is not so limited. Cutout 30 may take on any functionally desirable shape that fits within overlay 8 including, but not limited to, the shape of a component without leads as illustrated in FIG. 4.

While the invention may be adapted to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed methods and apparatus may be utilized in, various combination and/or independently. Thus, the invention is not limited to only those combinations shown herein, but rather may include other combinations.

What is claimed is:

1. A method of manufacturing an overlay for verification of the correct assembly of a circuit board, the method comprising the steps of:

obtaining a sheet of material having an outer surface, wherein at least the outer surface of the sheet has static dissipative properties; and cutting the sheet of material to create at least one cutout, wherein the at least one cutout corresponds to a location on the circuit board of a respective targeted component to be verified;

wherein the step of cutting the sheet of material further comprises using a laser to create the at least one cutout.

2. The method of manufacturing an overlay as described in claim 1, wherein the laser has a cutting diameter of about 0.005 inches or less.

3. The method of manufacturing an overlay as described in claim 1, wherein each of the at least one cutout is defined by substantially the shape of its respective targeted component.

4. The method of manufacturing an overlay as described in claim 1, wherein at least one respective targeted component has leads for connecting to the circuit board, and at least one cutout is defined by substantially the shape of the leads of said at least one respective targeted component.

5. The method of manufacturing an overlay as described in claim 1, wherein at least one respective targeted component has leads for connecting to the circuit board, and at least one cutout is defined by substantially the shape of said respective targeted component and the shape of the leads of said respective targeted component.

6. The method of manufacturing an overlay as described in claim 1, further comprising the step of:

marking the sheet with alignment information.

7. The method of manufacturing an overlay as described in claim 1, wherein the sheet of material is substantially opaque.

8. The method of manufacturing an overlay as described in claim 1, wherein the sheet of material comprises static dissipative material.

9. A method of manufacturing an overlay for verifying connect placement of components on a circuit board, the method comprising the steps of:

obtaining a static dissipative sheet;

obtaining information from a design layout of the circuit board regarding at least one target component on the circuit board to be verified;

determining size, shape, and location specifications of at least one cutout corresponding to the at least one target component on the circuit board by using information obtained from the design sheet about the at least one target component; and precisely cutting the at least one cutout in the static dissipative sheet corresponding to the size, shape, and location specifications of the respective at least one cutout;

wherein the step of precisely cutting the at least one cutout in the static dissipative sheet further comprises using a laser to create the at least one cutout.

10. The method of claim 9, further comprising the step of decreasing the thickness of the sheet of static dissipative material at predetermined locations.

11. The method of claim 9, further comprising the step of marking the sheet with alignment information.

12. The method of claim 9, wherein the design layout is a PCB Design Layout.

13. The method of claim 9, wherein the step of determining the size, and shape location specifications of the at least one cutout further comprises the steps of:

storing the size and shape specifications of the at least one target component; and using the stored size and shape specifications of the at least one target component to determine a size and shape of additional target components that are substantially similar to said at least one target component.

* * * * *

UNITED STATES PATENT AND TRADEMARK OFFICE
CERTIFICATE OF CORRECTION

PATENT NO.     : 6,489,586 B1
DATED          : December 3, 2002
INVENTOR(S)    : Abimael Corral It is certified that error appears in the above-identified patent and that said Letters Patent is hereby corrected as shown below:

<u>Column 8,</u>
Line 15, delete the word "connect" and substitute therefor -- correct --.
Line 43, delete the phrase "and shape location" and substitute therefor -- shape and location --.

Signed and Sealed this

Sixteenth Day of September, 2003

JAMES E. ROGAN
*Director of the United States Patent and Trademark Office*